US006636028B2

(12) United States Patent
Lavoie et al.

(10) Patent No.: US 6,636,028 B2
(45) Date of Patent: Oct. 21, 2003

(54) ELECTRONIC ELECTRICITY METER CONFIGURED TO CORRECT FOR TRANSFORMER INACCURACIES

(75) Inventors: Gregory P. Lavoie, Bristol, CT (US); David D. Elmore, Brookston, IN (US); Larry A. Schmidt, Rochester, NY (US); Robert Edward Lee, Jr., Durham, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/681,764

(22) Filed: Jun. 1, 2001

(65) Prior Publication Data

US 2002/0180420 A1 Dec. 5, 2002

(51) Int. Cl.[7] .............................................. G01R 11/32
(52) U.S. Cl. ........................................ 324/74; 324/142
(58) Field of Search ................. 324/140, 142, 324/74; 340/870.01, 870.02; 702/62, 85, 106, 60–61

(56) References Cited

U.S. PATENT DOCUMENTS

| 3,732,489 | A | * | 5/1973 | Nelson et al. ............... 324/726 |
| 4,837,504 | A | | 6/1989 | Baer et al. |
| 5,469,049 | A | * | 11/1995 | Briese et al. ............. 324/76.77 |
| 5,548,527 | A | | 8/1996 | Hemminger et al. |
| 5,742,512 | A | | 4/1998 | Edge et al. |
| 5,924,051 | A | | 7/1999 | Provost et al. |
| 6,133,720 | A | | 10/2000 | Elmore |
| 6,256,128 | B1 | | 7/2001 | Lavoie et al. |
| 6,459,258 | B1 | * | 10/2002 | Lavoie et al. ................ 324/142 |

* cited by examiner

*Primary Examiner*—Vinh P. Nguyen
(74) *Attorney, Agent, or Firm*—Karl A. Vick, Esq.; Armstrong Teasdale LLP

(57) ABSTRACT

An electronic electricity meter includes voltage sensors configured to generate measurements of voltage at voltage elements, current sensors configured to generate measurements of current through current elements, a microcomputer coupled to the current and voltage sensors and configured to control operation of the meter, and a memory coupled to the microcomputer including calibration constants to compensate for instrument transformer ratio and phase angle errors. The microcomputer is configured to use the calibration constants, when so instructed, to correct for measurement errors that occur based upon instrument transformer ratios and phase angles and to correct metering quantities calculated by the microcomputer.

23 Claims, 2 Drawing Sheets

ELECTRONIC ELECTRICITY METER CONFIGURED TO CORRECT FOR TRANSFORMER INACCURACIES

BACKGROUND OF INVENTION

This invention relates generally to electricity metering, and more particularly, to calibration of a microcomputer based electricity meter.

Some known electronic electricity meters for metering multi-phase services include a digital signal processor (DSP) and a microcomputer. The DSP processes the digital voltage and current signals to generate metering values, and then the microcomputer uses such metering values to generate additional values, e.g., demand and kVA. Data and commands are communicated between the DSP and the microcomputer.

For some metering installations, voltage and/or current being supplied to the load is too high for direct coupling of the meter to the power line. Therefore, voltage transformers and/or current transformers are utilized to step down the voltage and/or current. Stepping down the voltage and/or current, however, can adversely affect the accuracy of the measurement of energy consumed by the load.

SUMMARY OF INVENTION

In one aspect, an electronic electricity meter which comprises voltage sensors configured to generate measurements of voltage at voltage elements, current sensors configured to generate measurements of current through current elements, a microcomputer coupled to the current and voltage sensors and configured to control operation of the meter, and a memory coupled to the microcomputer and configured to store configuration and metering data, is provided. The memory further comprises calibration constants to compensate for instrument transformer ratio and phase angle errors, and the microcomputer is configured to use the calibration constants, when so instructed, to correct for instrument transformer ratios and phase angle errors.

In another aspect, a method for compensating for instrument transformer induced measurement errors in an electronic electricity meter is provided. The method comprises configuring the meter memory with calibration constants to compensate for instrument transformer induced ratio and phase angle errors, enabling the calibration constants via a software switch stored in the memory, and correcting measured metering quantities calculated by the microcomputer using the calibration constants.

In still another aspect, an electronic electricity meter is provided that is configured to store a set of calibration constants in a non-volatile memory of said meter for instrument transformer ratio and phase angle error compensation, store a software switch for enabling or disabling the instrument transformer ratio and phase angle compensation in the meter; and meter a plurality of electrical quantities of a power source. The meter having a microcomputer configured to selectively employ error compensation values, based on a value of the software switch and the calibration constants. The calibration constants are configured to compensate for errors by instrument transformers, and the calibration constants comprise at least one of a calculated instrument transformer gain coefficient for each voltage and current element in the meter, and an instrument transformer phase correction for each voltage and current element in the meter.

In yet another aspect, a processor for use in an electronic electricity meter is provided. The processor is configured to use calibration constants to compensate for instrument transformer ratio and phase angle errors, and the calibration constants comprise a determined instrument transformer gain coefficient for each voltage and current element in the meter and an instrument transformer phase correction for each voltage and current element in the meter.

DETAILED DESCRIPTION

Figure 1:
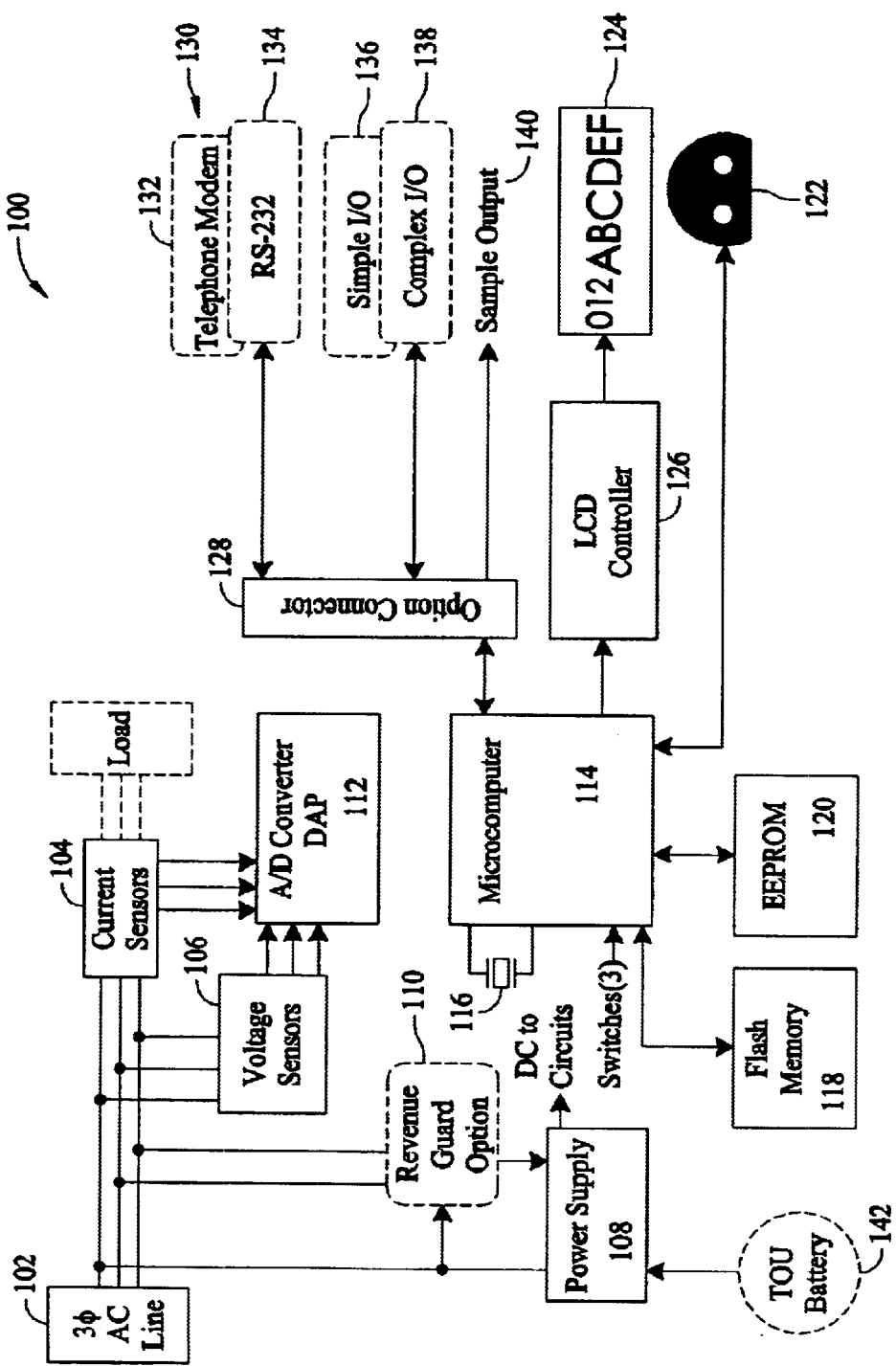
FIG. 1 is a block diagram of an electricity meter.

FIG. 1 is a block diagram of an electricity meter 100. Meter 100 is coupled to a three phase, alternating current (AC) power source 102. Particularly, current sensors 104 and voltage sensors 106 are coupled to power source 102 and generate measures of current and voltage for each current element and voltage element, respectively, within meter 100. Current and voltage sensors 104 and 106 are well known in the art.

In addition, a power supply 108 and a revenue guard option board 110 also are coupled to power source 102. Power source 102 represents power applied to meter 100 for metering. In certain installations, power source 102 represents power that has been stepped down for metering using at least one of current transformers and voltage transformers (not shown).

Current and voltage measurements output by sensors 104 and 106 are supplied to an analog-to-digital (A/D) converter 112. Converter 112, in the exemplary embodiment, is an 8 channel delta-sigma type converter. Converter 112 is coupled to a microcomputer 114. In the illustrated embodiment, microcomputer 114 is a 32 bit microcomputer with 2 Mbit of ROM and 64 Kbit of RAM. A 32 kHz crystal 116 provides a timekeeping signal for microcomputer 114. Alternatively, a line frequency of power supply 102 provides a timekeeping signal to microcomputer 114. Microcomputer 114 is coupled to a flash memory 118 and an electronically erasable programmable (i.e., reprogrammable) read only memory (EEPROM) 120.

Meter 100 also includes an optical port 122 coupled to, and controlled by, microcomputer 114. Optical port 122, as is well known in the art, is used for communicating data and commands to and from an external reader to microcomputer 114. In one embodiment, communications via port 122 are performed in accordance with ANSI C12.18 (optical port) and ANSI C12.19 (standard tables). A liquid crystal display 124 also is coupled to microcomputer 114 via an LCD controller 126. In addition, an option connector 128, coupled to microcomputer 114, is provided to enable coupling option boards 130 (e.g., a telephone modem board 132, an RS-232 line 134, a simple input/output (I/O) board 136, or a complex I/O board 138) to microcomputer 114. Option connector 128 also includes a sample output 140. When configured to operate in a time-of-use mode, a battery 142 is coupled to power source 102 to serve as a back-up to maintain date and time in the event of a power outage.

As shown in FIG. 1, meter 100 includes an optical port 122 for communications with external hand held units and other devices. To enable such communications, both the external unit and optical port 122 include phototransistors. Meter 100 can store significant volume of data (e.g., 2 months of load profile data for 20 channels), and it is desirable to quickly transmit such data to a hand held unit during a communication session. A phototransistor, however, requires that the voltage across the transistor must change in order to switch from a first state to a second state.

In one embodiment, code is downloaded into an external flash memory, and then a measurement profile is programmed to use the calculation specified by the code. Vectors are used to update and perform a list of tasks in ROM, or are replaced by versions in flash memory for other function blocks.

In other embodiments, an electrically erasable programmable (i.e., reprogrammable) read only memory (EEPROM) 120 is used for part of the nonvolatile, alterable memory. Some of the data that is described above as being stored in flash memory is stored, instead, in EEPROM 120. However, the load profile is still stored in flash memory 118.

It should be recognized that in still other embodiments, other types of nonvolatile, alterable memory can be substituted for EEPROM 120 and flash memory 118. The memory or memories used should retain their contents during periods when power is not applied, and it should be possible to update their contents as needed, although not necessarily in the manner required by a flash memory. One skilled in the art would be able to select appropriate memories and make the necessary circuit modifications to use the selected memory or memories.

Figure 2:
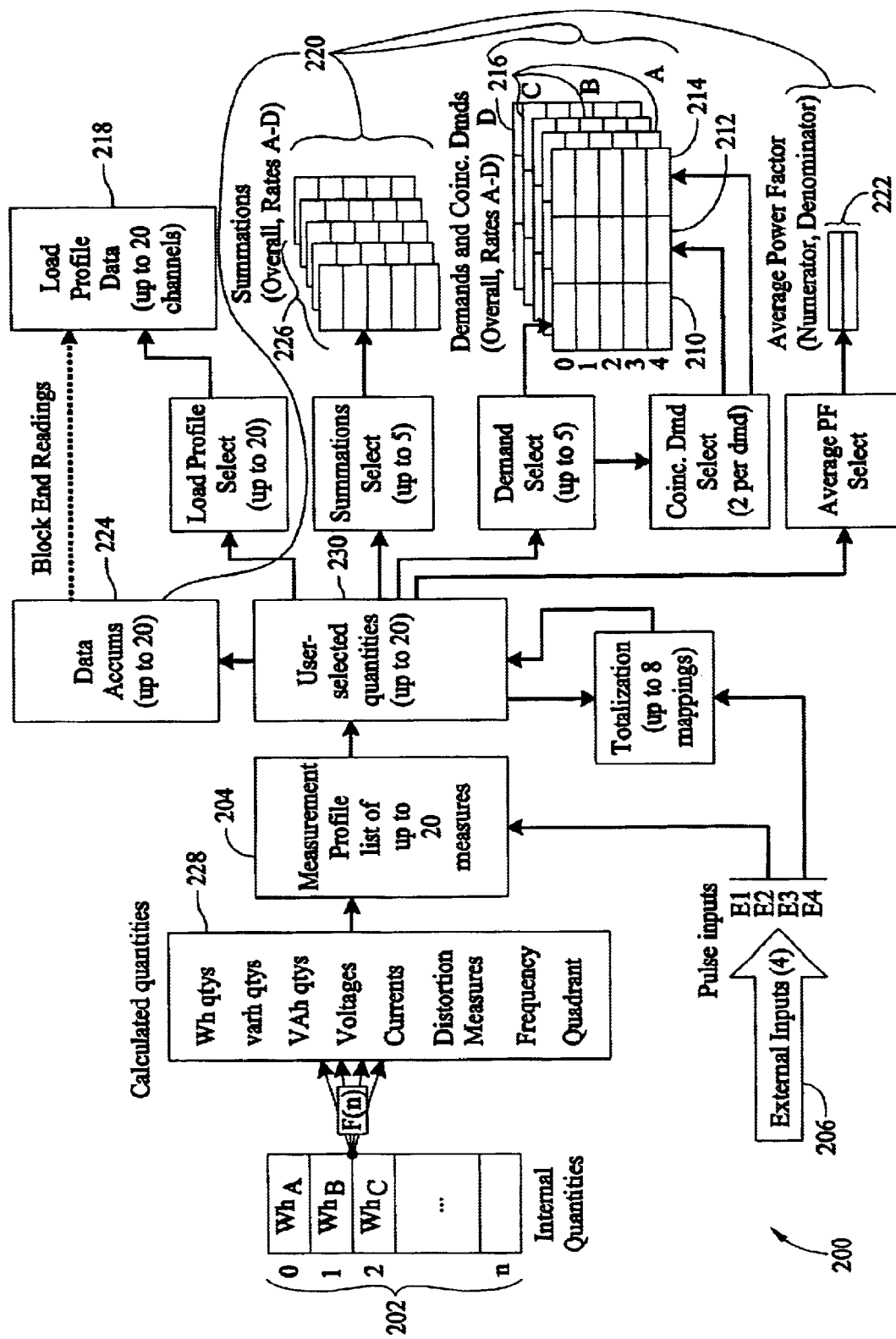
FIG. 2 is a data flow diagram for the electricity meter shown in FIG. 1.

FIG. 2 is a data flow diagram 200 for the electricity meter 100. As illustrated by FIG. 2, quantities such as watt hours per phase (WhA, WhB, WhC) as well as other quantities are determined by microcomputer 114. These quantities are sometimes referred to herein as internal quantities 202. Microcomputer 114 then uses the predefined or user-selected functions F(n), described in further detail below, to calculate a set of quantities (referred to as calculated quantities 228). Microcomputer 114 then uses the measurement profile 204 to select up to 20 quantities to store as user-selected quantities. In addition, external inputs 206 can be specified to be accumulated by measurement profile 204. In the embodiment shown in FIG. 2, up to four external inputs (E1, E2, E3, E4) are collected. These inputs may also be scaled by programmed multipliers and divisors.

User-selected quantities 230 specified by measurement profile 204 can be used to perform totalization. For example, a value from a register location in user-selected quantities 230 (e.g., register 7) can be added to a value stored in a register location (e.g., register 17) to provide a totalized value, and the totalized value is stored in a register location (e.g., register 17). In the embodiment illustrated in FIG. 2, up to 8 totalizations can be performed. In addition, user selected quantities 230 may include quantities for use in calibrating energy consumption measurements as described below.

Also in the embodiment shown in FIG. 2, five demand values (locations 0–4) 210 can be calculated from the quantities in user-selected quantities 230. The values to use for the demand calculations are specified by the demand select. Each demand value may have up to two coincident demands 212, 214 per demand 210. The coincident demands are specified by the coincident select. A coincident demand value may be another one of the selected demands, or the quotient of two selected demands. An average power factor 222 is stored in numerator and denominator form. Time-of-use summaries (A–D) 216 for the selected demands are also available in a time-of-use meter. Quantities are recorded in load profile data 218. The quantities to be recorded are specified by the load profile select. Up to five summations 226 can be calculated. The quantities to be calculated are specified by the summations select. Time of use summaries (A–D) 216 for the selected summations are also available in a time-of-use meter. Data accumulations 224, summations 226, demands 210 coincident demands 212, 214, and time-of-use summaries 216 may be selected for display 210 on the meter's LCD.

Meter 100 can be programmed by an operator, e.g., a utility, so that meter 100 determines desired quantities, regardless of whether that quantity is a common, IEEE-defined value such as apparent volt-ampere-hours, or a quantity used only by a particular utility. Generally, a momentary interval is defined as 60 cycles (for 60 Hz installations) or 50 cycles (for 50 Hz installations) of the fundamental voltage frequency. Known meters calculate a pre-defined set of quantities from the basic quantities every momentary interval. These quantities include total watt-hours (fundamental plus harmonics), apparent volt-ampere-hours, and arithmetic apparent volt-ampere hours.

Typically there is very little flexibility provided by electricity meters in how the momentary interval basic quantities are processed to generate the revenue quantities that are of interest to utilities. A user may, for example, select from several predefined quantities that are computed at every momentary interval, and the user may select the length of the demand interval or subinterval and the length of the load profile interval.

In contrast, meter 100 enables a user to define methods of data calculations at all points in the data processing sequence, e.g, at the end of a momentary interval, at the end of a minute, at the end of a demand (sub)interval, and at the end of a load profile interval.

Because a user can specify mathematical operations to be performed on data at a number of steps in the processing of metering data, meter 100 provides that a wide variety of quantities can be determined. Meter 100 also prevents the meter manufacturer from having to anticipate at the product development stage what quantities a utility might require. Since there are constraints that a user must be aware of when programming a meter to compute a given quantity, it is likely that the meter manufacturer would implement a program that defines the calculations as described by the utility. The utility would then install the program into its programming software package, which would ultimately download the program into meter 100. Certain computed quantities are dependent upon electrical characteristics found at the metering site, the electrical characteristics can affect measured quantities and in turn the computed quantities. To compensate for the electrical characteristics at a given metering site, the program within meter 100 is updated at the site based upon observed and measured characteristics.

Calibration Constants for Transformer Inaccuracies

In one embodiment, microcomputer 114 is configured to compensate for energy losses that occur within voltage and current transformers used to step down an electrical supply for metering. The voltage and current transformers may also affect phase relationships of the electrical supply being metered, resulting in phase angle errors. Compensation is enabled if a user selects this option. In such an embodiment, transformer inaccuracy compensation is enabled if a transformer inaccuracy compensation software switch is set in memory, for example, in flash memory 118 or EEPROM 120, for recognition by microcomputer 114, resulting in electrical consumption measurements which are adjusted by an alternate set of calibration constants as described below. In one embodiment, by using the software switch, calibration features and error compensation may appropriately be enabled or disabled by a user depending on the meter application and operating conditions.

In an illustrative embodiment, the software switch is a two bit switch that facilitates both user programming of calibration constants and enabling/disabling of instrument error correction according to a value of the respective bits. It is contemplated, however, that other software switching schemes may be employed in alternative embodiments without departing from the scope of the present invention.

In one exemplary embodiment, microcomputer 114 is configured with 12 factory calibration constants which include three voltage gain coefficients, three current gain coefficients, three voltage phase corrections and three current phase corrections, one for each phase of the electrical power being supplied. The constants are used when determining demands and other calculated quantities as described above, for example, watt-hours. In other embodiments, coefficients and corrections for single phase electrical applications are contemplated. In addition, in an exemplary embodiment, microcomputer 114 is configured with an alternate set of 12 calibration constants, based upon data loaded into meter 100 at installation. The additional 12 constants take into account current transformer ratios, voltage transformer ratios, and phase angle correction factors for the instrument transformers used to step down the voltage and current at the installation site for metering. The additional constants are then used to determine demands and other metering quantities. The ratios and factors correspond to performance of the voltage and/or current transformers as measured or calculated at the meter installation site.

Use of current transformers and voltage transformers, collectively described as instrument transformers, introduce inaccuracies in the power being measured by meter 100. Such inaccuracies include the voltages and currents, and phase angles of the power present at the transformer secondaries. Inaccuracies are likely caused by the electrical properties of the materials used to construct such transformers. One such inaccuracy is gain of the transformers. A formula for adjusting gain coefficients, based upon instrument transformer ratio correction factors is defined as $GC_{new}=RCF \times GC_{old}$, where RCF=an instrument transformer (voltage transformer or current transformer) ratio correction factor which is loaded at meter installation, $GC_{old}$=meter factory calibration gain coefficient (one for each voltage and current element of meter 100), and $GC_{new}$=calculated instrument transformer gain coefficient (one for each voltage and current element). Meter 100 is, as described above, configured to store three current gain coefficients and three voltage gain coefficients, in flash memory 118 or EEPROM 120 for use by microcomputer 114 in determining demands and calculating metering quantities.

Phase angle corrections are also implemented within flash memory 118 or EEPROM 120 of meter 100 for use by microcomputer 114 to correct for phase angle changes which are induced by the use of the voltage and current transformers. A calculated instrument transformer phase correction ($PC_{new}$) (one for each voltage and current element of meter 100) is calculated as follows:

$$Pc_{new}=2^{15} \times (SIN(\omega T_s)+SIN(PCA_{new})/SIN(\omega T_s - PCA_{new}))$$, where $\omega T_s = 2\pi(F_{line}/F_{sampling})$, and $PCA_{new}$ is an instrument transformer phase correction angle (one for each voltage and current element). In one embodiment, $PCA_{new}$ is calculated as $PCA_{old} - PE$, where $PC_{old}$ is a meter factory calibration phase correction (one for each voltage and current element) and PE is an instrument transformer (voltage or current) phase angle error, which is loaded at meter installation.

In one embodiment, the meter's phase correction angle, one for each voltage and current element ($PCA_{old}$), is calculated as $PCA_{old}=ATAN\{(K_{old}-(1/K_{old})) \times SIN(\omega T_s)/[2+(K_{old}+(1/K_{old})) \times COS(\omega T_s)]$, where $K_{old}=PC_{old}/2^{15}$, and $PC_{old}$ is a meter's factory calibration phase correction for each voltage and current element, and $\omega T_s=2\pi(F_{line}/F_{sampling})$.

In the above calculations, $F_{line}$ is the meter programmed line frequency (50 or 60 Hz) and $F_{sampling}$ is the meter sampling rate. In one exemplary embodiment of meter 100, microcomputer 114 is configured with a 3281.25 Hz sampling rate. While such a sampling rate is exemplary for the embodiment described herein, other sampling rates are known to exist for other contemplated embodiments.

In one embodiment, calculations using the above-described phase angle correction formulas and equations with appropriate data values are executed on a separate system, such as for example, a desktop or laptop personal computer (not shown) and the computational results are loaded into meter memory 118 and/or 120 according to known techniques. As such, the corrections are determined previously and loaded into meter memory. In another embodiment, phase angle correction formulas are stored within flash memory 118 or EEPROM 120 and the corrections are calculated by microcomputer 114. In addition, to calculate the corrections, a plurality of variables may stored in memory locations (flash or EEPROM) within meter 100, as described above or are provided by an operator who inputs the values into the meter, for example, using optical port 122.

Once determined, whether by direct calculation by microcomputer or remote calculation on another system, the calibration constants (e.g. $GC_{new}$ and $PC_{new}$) are stored in memory and selectively used by microcomputer 114, depending upon the state of the software switch, to compensate for inaccuracies based upon instrument transformer ratio errors and phase angle errors that occur within the instrument transformers at a meter installation. Variables which describe those inaccuracies are calculated or otherwise determined, stored within meter 100 and used by meter 100 to more accurately measure the electricity being consumed at a site. The variables are determined based upon known or measured transformer errors which are entered into meter 100, for example, by a meter engineer at a site installation. The constants are used to adjust measured metered quantities to provide a more accurate determination of power consumption within a facility.

While the invention has been described in terms of various specific embodiments, those skilled in the art will recognize that the invention can be practiced with modification within the spirit and scope of the claims.

What is claimed is:

1. An electronic electricity meter comprising:
voltage sensors configured to generate a signal proportional to a sensed voltage supplied by an instrument transformer;
current sensors configured to generate a signal proportional to a sensed current supplied by an instrument transformer;
a microcomputer coupled to the current and voltage sensors and configured to control operation of said meter; and
a memory coupled to said microcomputer and configured to store configuration and metering data, said memory further comprising calibration constants to compensate for instrument transformer ratio and phase angle errors, said microcomputer configured to use said calibration constants, when so instructed, to correct for measurement errors that occur based upon instrument transformer ratios and phase angles, to correct metering quantities calculated by said microcomputer.

2. An electronic electricity meter according to claim 1 wherein said calibration constants are enabled via a software switch stored in said memory.

3. An electronic electricity meter according to claim 1 wherein said memory comprises:

an instrument transformer ratio correction factor for voltage;

an instrument transformer ratio correction factor for current;

a factory calibration gain coefficient for each voltage and current supplied by the instrument transformer to said meter;

a determined instrument transformer gain coefficient for voltage and current supplied by the instrument transformer to said meter;

an instrument transformer phase angle error for voltage;

an instrument transformer phase angle error for currents a factory calibration phase correction for voltage and current supplied by the instrument transformer to said meter;

a calculated instrument transformer phase correction for voltage and current supplied by the instrument transformer to said meter;

a phase correction angle for voltage and current supplied by the instrument transformer to said meter; and an instrument transformer phase correction angle for voltage and current supplied by the instrument transformer to said meter.

4. An electronic electricity meter according to claim 3 wherein said determined instrument transformer gain coefficient for each voltage and current supplied by the instrument transformer to said meter is determined by the respective instrument transformer ratio correction factor×a factory calibration gain coefficient.

5. An electronic electricity meter according to claim 3 wherein said instrument transformer phase correction angle for each voltage and current supplied by the instrument transformer to said meter is determined as a phase correction angle–the instrument transformer phase angle error, where the phase correction an le is calculated as $PCA_{old}=ATAN\{(K_{old}-(1/K_{old}))\times SIN(\omega T_s)/[2(K_{old}+(1/K_{old}))\times COS(\omega T_s)]$, where $\omega T_s=2\pi(F_{line}/F_{sampling})$ and $K_{old}=$a factory calibration phase correction/215, for each voltage and current supplied by the instrument transformer to said meter.

6. An electronic electricity meter according to claim 5 wherein said instrument transformer phase correction for each voltage and current supplied by the instrument transformer to said meter is determined as $PC_{new}=2^{15}\times(SIN(\omega T_s)+SIN(PCA_{new})/SIN(\omega T_s-PCA_{new}))$, where $PCA_{new}$ is the instrument transformer phase correction angle for each voltage and current supplied by the instrument transformer to said meter.

7. An electronic electricity meter according to claim 5 wherein $F_{line}$ is equal to one of 50 Hz or 60 Hz and $F_{sampling}$ is equal to 3281.25 Hz.

8. An electronic electricity meter according to claim 1 wherein said memory is at least one of flash memory or electrically erasable programmable read only memory.

9. A method for compensating for instrument transformer induced measurement errors in an electronic electricity meter, the met including current sensors configured to generate a signal proportional to a sensed current supplied by an instrument transformer, voltage sensors configured to generate a signal proportional to a sensed voltage supplied by the instrument transformer, a microcomputer coupled to the current and voltage sensors and configured to control operation of the meter, and a memory coupled to the microcomputer and configured to store configuration and metering data, said method comprising the steps of:

configuring the memory with calibration constants to compensate for instrument transformer ratio and phase angle errors;

enabling the calibration constants via a software switch stored in the memory; and correcting measured metering quantities calculated by the microcomputer using the calibration constants.

10. A method according to claim 9 wherein said step of configuring the memory with calibration constants comprises the steps of:

calculating an instrument transformer gain coefficient for each voltage and current supplied by the instrument transformer to said meter;

calculating an instrument transformer phase correction angle for each voltage and current supplied by the instrument transformer to said meter;

calculating an instrument transformer phase correction for each voltage and current supplied by the instrument transformer to said meter; and storing the calculated instrument transformer gain coefficient, instrument transformer phase correction angle, and instrument transformer phase correction in the memory.

11. A method according to claim 10 wherein the instrument transformer gain coefficient for each voltage and current supplied by the instrument transformer to said meter is calculated as an instrument transformer ratio correction factor×a factory calibration gain coefficient for each voltage and current supplied by the instrument transformer to said meter.

12. A method according to claim 11 wherein the instrument transformer ratio correction factor is one of a voltage correction factor or a current correction factor.

13. A method according to claim 10 wherein instrument transformer phase correction angle for each voltage and current supplied by the instrument transformer to said meter is calculated as a meter phase correction angle for each voltage and current supplied by the instrument transformer to said meter–an instrument transformer phase angle error.

14. A method according to claim 13 wherein the instrument transformer phase angle error is one of a voltage transformer phase angle error and a current phase angle error.

15. A method according to claim 1 wherein the meter phase correction angle for each voltage and current supplied by the instrument transformer to said meter is calculated as $PCA_{old}=ATAN\{(K_{old}-(1/K_{old}))\times SIN(\omega T_s)/[2+(K_{old}+(1/K_{old}))\times COS(\omega T_s)]$, where $\omega T_s=2\pi(F_{line}/F_{sampling})$ and $K_{old}=$a factory calibration phase correction for each voltage and current supplied by the instrument transformer to said meter/$2^{15}$.

16. A method according to claim 13 wherein the instrument transformer phase correction for each voltage and current supplied by the instrument transformer to said meter is calculated as $PC_{new}=2^{15}\times(SIN(\omega T_s)+SIN(PCA_{new})/SIN(\omega T_s-PCA_{new}))$, where $PCA_{new}$ is the instrument transformer phase correction angle for each voltage and current supplied by the instrument transformer to said meter and $\omega T_s = 2\pi(F_{line}/F_{sampling})$.

17. An electronic electricity meter configured to:
store a set of calibration constants in a non-volatile memory of said meter for instrument transformer ratio and phase angle error compensation;
store a software switch for enabling or disabling the instrument transformer ratio and phase angle compensation in said meter; and
meter a plurality of electrical quantities of a power source including an instrument transformer;
and said meter having a microcomputer configured to selectively employ error compensation values, based on a value of the software switch and the calibration constants, the calibration constants configured to compensate for errors by instrument transformers, the calibration constants comprising at least one of a calculated instrument transformer gain coefficient for each voltage and current supplied by the instrument transformer to said meter, and an instrument transformer phase correction for each voltage current supplied by the instrument transformer to said meter.

18. An electronic electricity meter according to claim 17 wherein the calculated instrument transformer gain coefficient for each voltage and current supplied by the instrument transformer to said meter is calculated as an instrument transformer ratio correction factor×a factory calibration gain coefficient for each voltage and current supplied by the instrument transformer to said meter.

19. An electronic electricity meter according to claim 17 wherein the instrument transformer phase correction for each voltage and current supplied by the instrument transformer to said meter is determined by the relationship $2^{15} \times (\text{SIN}(\omega T_s) + \text{SIN}(PCA_{new})/\text{SIN}(\omega T_s - PCA_{new}))$, where $\omega T_s = 2(F_{line}/F_{sampling})$ and $PCA_{new}$ is the instrument transformer phase correction angle for each voltage and current supplied by the instrument transformer to said meter, which is calculated as $PCA_{old}$—an instrument transformer phase angle error, where $PCA_{old} = \text{ATAN}\{(K_{old}-(1/K_{old}))\times\text{SIN}(\omega T_s)/[2+(K_{old}+(1/K_{old}))\times\text{COS}(\omega T_s)]$, where $\omega T_s 2\pi(F_{line}/F_{sampling})$ and $K_{old}$=a factory calibration phase correction for each voltage and current supplied by the instrument transformer to said meter/$2^{15}$.

20. A processor for use in an electric electricity meter, said processor configured to use calibration constants to compensate for instrument transformer ratio and phase angle errors, said calibration constants comprising:
a determined instrument transformer gain coefficient for each voltage and current supplied by the instrument transformer to the meter; and
an instrument transformer phase correction for each voltage and current supplied by the instrument transformer to the meter.

21. A processor according to claim 20 wherein said calculated instrument transformer gain coefficient is calculated as an instrument transformer ratio correction factor×a factory calibration gain coefficient for each voltage and current supplied by the instrument transformer to said meter in said meter.

22. A processor according to claim 20 wherein said instrument transformer phase correction is determined by the relationship $2^{15} \times (\text{SIN}(\omega T_s) + \text{SIN}(PCA_{new})/\text{SIN}(\omega T_s - PCA_{new}))$, wherein said processor further configured to calculate $\omega T_s$ as $2\pi(F_{line}/F_{sampling})$ and $PCA_{new}$ as $PCA_{old}$—an instrument transformer phase angle error, where $PCA_{old} = \text{ATAN}\{(K_{old}-(1/K_{old}))\times\text{SIN}(\omega T_s)/[2+(K_{old}+(1/K_{old}))\times\text{COS}(\omega T_s)]$, where $K_{old}$=a factory calibration phase correction for each voltage and current supplied by the instrument transformer to the meter/$2^{15}$.

23. A processor according to claim 22 wherein $F_{line}$ is one of 50 Hz or 60 Hz and $F_{sampling}$ is 3281.25 Hz.

* * * * *

UNITED STATES PATENT AND TRADEMARK OFFICE
CERTIFICATE OF CORRECTION

PATENT NO. : 6,636,028 B2
DATED : October 21, 2003
INVENTOR(S) : Lavoie et al.

It is certified that error appears in the above-identified patent and that said Letters Patent is hereby corrected as shown below:

Column 7,
Line 47, delete "correction an le" and insert therefor -- correction angle --.
Line 48, delete "$[2(K_{old} + (1 / K_{old})) \times COS(\omega T_s)]$" and insert therefor
-- $[2 + (K_{old} + (1 / K_{old})) \times COS(\omega T_s)]$ --.
Line 50, delete "correction/215" and insert therefor -- correction/$2^{15}$ --.

Column 8,
Line 1, delete "the met" and insert therefor -- the meter --.

Column 9,
Line 21, "voltage current" and insert therefor -- voltage and current --.
Line 35, delete "$\omega T_s = 2(F_{line}$" and insert therefor -- $\omega T_s = 2_\Pi(F_{line}$ --.

Column 10,
Line 4, delete "$\omega T_s 2_\Pi(F_{line}$" and insert therefor -- $\omega T_s = 2_\Pi(F_{line}$ --.
Line 8, delete "electric" and insert therefor -- electronic --.

Signed and Sealed this

Twenty-third Day of March, 2004

JON W. DUDAS
*Acting Director of the United States Patent and Trademark Office*